(12) United States Patent
Zhang et al.

(10) Patent No.: US 9,301,429 B2
(45) Date of Patent: Mar. 29, 2016

(54) THERMAL BLOCKER FOR MOBILE DEVICE SKIN HOT SPOT MANAGEMENT

(71) Applicant: Apple Inc., Cupertino, CA (US)

(72) Inventors: Lian Zhang, Cupertino, CA (US); Amaury J. Heresztyn, Cupertino, CA (US); Frank F. Liang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 126 days.

(21) Appl. No.: 13/940,171

(22) Filed: Jul. 11, 2013

(65) Prior Publication Data

US 2014/0085911 A1 Mar. 27, 2014

Related U.S. Application Data (60) Provisional application No. 61/705,611, filed on Sep. 25, 2012.

(51) Int. Cl.
*F21V 29/00* (2015.01)
*G06F 3/041* (2006.01)
*H05K 7/20* (2006.01)
*H05K 5/00* (2006.01)
*H01L 23/373* (2006.01)
*H04M 1/02* (2006.01)
*G02F 1/1333* (2006.01)

(52) U.S. Cl.
CPC .......... *H05K 7/20436* (2013.01); *H01L 23/373* (2013.01); *H04M 1/0266* (2013.01); *H05K 5/0017* (2013.01); *G02F 1/13338* (2013.01); *G06F 3/0412* (2013.01); *H01L 2924/0002* (2013.01); *Y10T 156/10* (2015.01)

(58) Field of Classification Search
CPC ..... H01L 23/34; H01L 23/367; H01L 23/373; H01L 33/64–33/644; G06F 3/041–3/047; G02F 1/13338; H05K 7/20436; H05K 5/0017; H04M 1/0266–1/027
USPC .......................... 362/294; 361/688, 704, 708
See application file for complete search history.

(56) References Cited

U.S. PATENT DOCUMENTS

| | | | | |
|---|---|---|---|---|
| 5,991,155 A | * | 11/1999 | Kobayashi et al. | 361/705 |
| 7,168,484 B2 | * | 1/2007 | Zhang et al. | 165/185 |
| 2005/0270746 A1 | * | 12/2005 | Reis | 361/708 |
| 2006/0268517 A1 | * | 11/2006 | Wang et al. | 361/695 |
| 2007/0263352 A1 | * | 11/2007 | Jones et al. | 361/688 |
| 2009/0231297 A1 | * | 9/2009 | Hatakeyama | G02B 6/0085 345/173 |
| 2011/0063801 A1 | * | 3/2011 | Lin et al. | 361/705 |
| 2012/0037916 A1 | * | 2/2012 | Song | H01L 27/323 257/72 |
| 2012/0069515 A1 | * | 3/2012 | Tan | 361/679.54 |
| 2012/0106063 A1 | * | 5/2012 | Mathew et al. | 361/679.21 |
| 2012/0113595 A1 | * | 5/2012 | Petroski | 361/704 |
| 2013/0177302 A1 | * | 7/2013 | Weber | 396/155 |
| 2015/0261258 A1 | * | 9/2015 | Kim | H01L 27/323 345/173 |

* cited by examiner

*Primary Examiner* — Mariceli Santiago
(74) *Attorney, Agent, or Firm* — Downey Brand LLP (57) ABSTRACT

The described embodiments relate generally to thermal management and more particularly to a method and apparatus for providing thermal insulation from relatively small heat sources in small form factor electronic devices. An insulator layer can be placed between a small heat source and an exterior surface of the device, such as a cover glass layer. In one embodiment, a graphite layer can also be included between the cover glass layer and the insulator layer to spread any transmitted heat across the cover glass layer.

20 Claims, 6 Drawing Sheets

THERMAL BLOCKER FOR MOBILE DEVICE SKIN HOT SPOT MANAGEMENT

CROSS-REFERENCE TO RELATED APPLICATION

This application claims priority under 35 U.S.C. 119(e) to U.S. Provisional Patent Application No. 61/705,611, filed Sep. 25, 2012, and entitled "THERMAL BLOCKER FOR MOBILE DEVICE SKIN HOT SPOT MANAGEMENT", which is incorporated herein by reference in its entirety and for all purposes.

FIELD OF THE DESCRIBED EMBODIMENTS

The described embodiments relate generally to thermal management and more particularly to a method and apparatus for providing thermal insulation from relatively small heat sources in small form factor electronic devices.

BACKGROUND

As technology advances, product designs in general, and designs for mobile products in particular, are becoming smaller and smaller. As device designs become smaller, the distance between electronic components within a device decreases. Moreover, the small size of many devices can prevent the use of active thermal management techniques such as cooling fans. As a result, heat generated by internal electronic components must be distributed and dissipated throughout the device by controlling the means of thermal conduction within the device. Often, small components such as cameras or light emitting diodes (LEDs) can create small point sources of heat within the device. When these heat sources are located close to exterior surfaces of the device, the heat can interfere with a user's ability to comfortably use the device. Additionally, excessive buildups of heat can decrease the performance of many electronic components and can result in uneven thermal expansion across a device. In order to prevent these problems, heat must be insulated from heat sensitive areas of the device while being spread and directed towards areas of the device that can act as heat sinks.

Therefore, what is desired is a reliable way to insulate and distribute heat generated by a heat source in an electronic device.

SUMMARY OF THE DESCRIBED EMBODIMENTS

This paper describes various embodiments that relate to insulating and distributing heat generated by heat sources in an electronic device. In one embodiment, a personal electronic device is described. The device can include a cover layer such as a cover glass layer or device housing. A conductive layer can be located below and in contact with the cover layer and can function as a heat spreader, distributing heat from a point source across a wide area of the cover layer. An insulator layer can be disposed below and in contact with the conductive layer. The insulator material can be formed from a polymer material, a polytetrafluoroethylene (PTFE) material, aerogel, or any other suitable thermally insulative material. A heat source such as a camera or light emitting diode can be located below and in contact with the insulator layer. The combination of the insulator layer and the conductive layer can reduce an amount of heat that is transmitted from the heat source to the cover layer.

According to another embodiment, a personal electronic device can include a cover layer, an insulator layer disposed below and in contact with the cover layer, and a heat source disposed below and in contact with the insulator layer. The insulator layer is configured to reduce an amount of heat transmitted from the heat source to the cover layer. The insulator material can be formed from a polymer material, a polytetrafluoroethylene (PTFE) material, aerogel, or any other suitable thermally insulative material.

According to yet another embodiment, a method for thermally insulating a cover glass layer from a heat source is disclosed. The method can include: (1) receiving a cover glass layer, (2) bonding a graphite layer to the cover glass layer, (3) bonding an insulator layer to the graphite layer, and (4) bonding a heat source to the insulator layer. The insulator material can be formed from a polymer material, a polytetrafluoroethylene (PTFE) material, aerogel, or any other suitable thermally insulative material.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings. These drawings do not limit any changes in form and detail that may be made to the described embodiments. Any such changes do not depart from the spirit and scope of the described embodiments.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The trend in modern electronic devices is to reduce device size. This can be accomplished by laminating multiple structural and electronic layers together, reducing or eliminating any air gaps that may have existed between the layers in earlier designs. The reduction of air gaps can allow for heat generated by electronic components within a device to flow throughout the device by thermal conduction. However, it can be unfavorable for heat to flow to some areas of an electronic device. For example, when the device includes a touch screen, an increase in the temperature of the touch screen or cover glass of the device can negatively impact the user experience. However, the small form factor of these devices can often require that heat sources be placed in close proximity to, and in some cases be laminated to, the touch screen or cover glass layer of the device. Additionally, buildups of heat in certain areas of a device can damage electronic components or lead to uneven thermal expansion that can result in structural strain and device malfunctions.

There are several structures that can be used to manage the flow of heat throughout a device. For example, insulator layers can be placed between two components to reduce an amount of heat conduction from one component to another. Additionally, heat spreaders can be provided to dissipate heat generated by a point source over a large area. For example a layer formed from a highly conductive material such as graphite can quickly and efficiently conduct heat away from a point source and spread it over a wide area. This can increase a rate at which heat dissipates by convection or other means and ensure that one area of the device does not exceed a critical temperature. In one embodiment, an insulator layer and a heat spreader can be combined to insulate and distribute heat generated by a small heat source within a device. The insulator layer can be located between the heat spreader and the heat source in a laminate stack up. When coupled to a heat source, the insulator layer can prevent an amount of heat from being conducted away from the heat source in the direction of the insulator layer. Furthermore, the heat spreader can evenly distribute any heat that does pass through the insulator layer, ensuring that no area exceeds a critical temperature.

The efficacy of reducing a flow of heat using an insulator layer can depend on several factors. One such factor can be the aspect ratio of the insulator layer. The aspect ratio can be defined as the surface area of the insulator layer divided by the thickness of the insulator layer. The aspect ratio of the insulator layer can be indicative of whether or not the insulator layer will be effective in preventing heat conduction. For example, an insulator layer having a surface area of 30 mm$^2$ and a thickness of 1 mm can have an aspect ratio of 30, while a 30 mm$^2$ surface area insulator area having a thickness of only 0.1 mm can have an aspect ration of 300. The lower the aspect ratio is, the more effective the insulation layer becomes. When an insulation layer is coupled to a heat source with a surface area equal to the insulator layer and the heat source has a power density greater than approximately 2 mW/mm$^2$, an insulator layer with an aspect ratio of approximately 50 or less can reduce heat conduction in the direction of the insulator layer by a significant amount. Small heat sources within electronic devices such as cameras and LED lights often have heat signatures and aspect ratios within this range. However, when a heat source with similar power density is coupled to an insulator layer with an aspect ratio greater than approximately 100, it can become more difficult for heat to spread from a middle region of the heat source to an outer region. As a result, much of the heat in the center of the heat source can pass directly through the insulator layer, resulting in relatively high heat conduction in the direction of the insulator layer.

Figure 1:
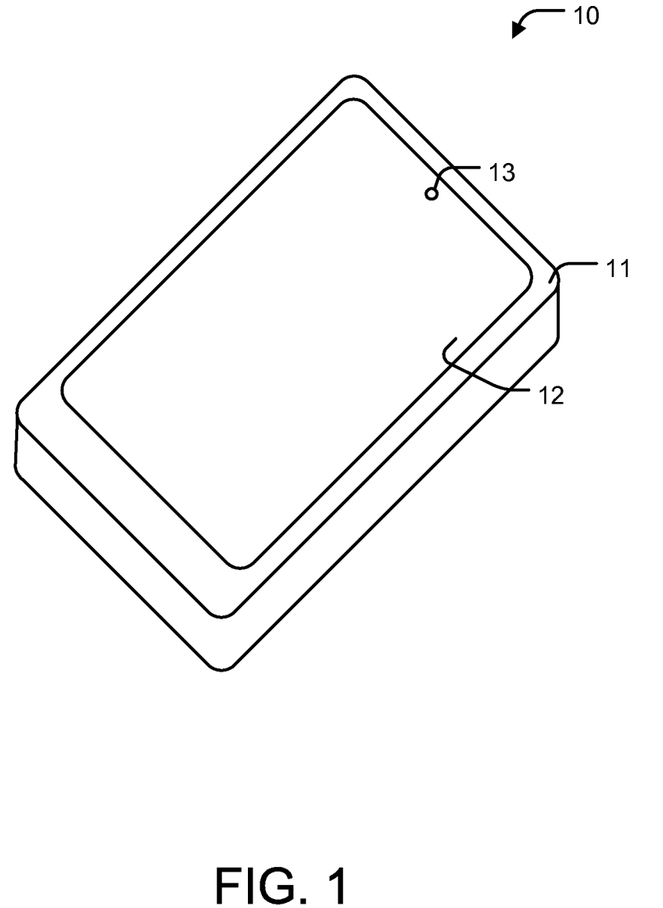
FIG. 1 is a perspective view of a personal electronic device, according to an exemplary embodiment.

FIG. 1 is a perspective view of a personal electronic device 10. In one embodiment, electronic device 10 can represent a small form factor touch screen device such as a smart phone, media player, tablet computer, mobile computing device, or similar device. However, the structures and methods disclosed in the present embodiment can be applicable to larger devices and devices without touch screens as well so these factors should not limit the scope of the present disclosure. The device 10 may include a housing 11 and a cover glass layer 12 arranged in or on the housing 11. Cover glass layer 12 can represent a surface of electronic device 10 including a display and touch screen. However, in other embodiments, cover glass layer 12 can represent any area of an electronic device which can require insulation from nearby heat sources. For example, in one embodiment, cover glass layer 12 can represent an outer structural housing for electronic device 10. In yet another embodiment, cover glass layer 12 can represent an interior structural member or an electronic component sensitive to changes in heat.

Device 10 may include a plurality of electronic components, including cameras, light emitting diodes, processors, batteries, antennas, and/or other components. One or more of these components may be mounted in relatively close proximity to, or in some cases bonded to, the cover glass layer 12. For example, device 10 may include a relatively small component 13 bonded to cover glass layer 12. The component 13 may have an aspect ratio as described above, and may include, for example, a camera, light emitting diode, or other component.

Figure 2:
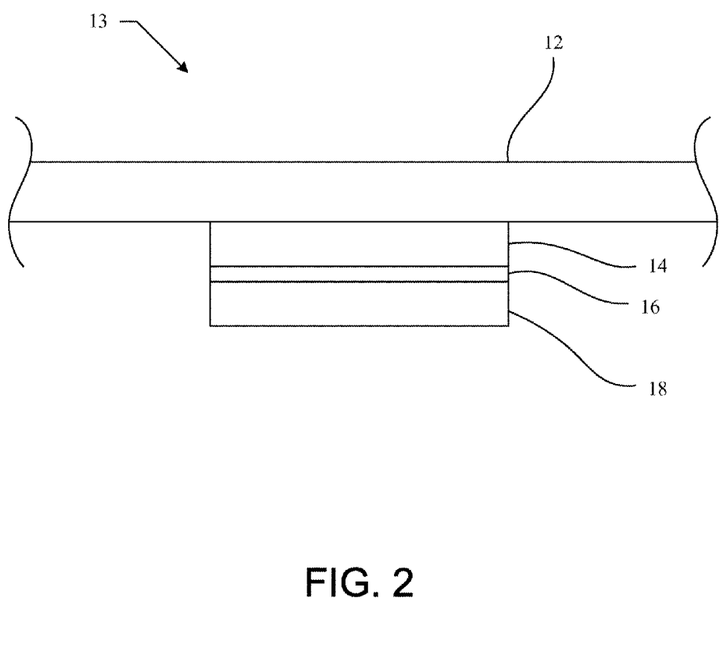
FIG. 2 shows an exemplary cross-sectional view of a portion of the device of FIG. 1.

For example, turning to FIG. 2, a cross sectional view of a portion of device 10 including component 13 is illustrated. As shown, an insulator layer 14 is bonded to the cover glass layer 12. The insulator layer 14 may be formed of an insulator material. The insulator material can be formed from a polymer material, a polytetrafluoroethylene (PTFE) material, aerogel, or any other suitable thermally insulative material.

As further shown, a stiffener 16 is bonded to the insulating later 14. Stiffener 16 can include a thin layer of any suitably rigid material, such as aluminum or steel. Heat source 18 is also bonded to stiffener 16. Heat source 18 may be any heat source, including, for example, a camera and/or light emitting diode. Insulator layer 14 can be bonded to both stiffener 16 and cover glass layer 12. In another embodiment, insulator layer 14 can be mechanically coupled to stiffener 16 and cover glass layer 12 using any technically feasible means. Insulator layer 14 can reduce an amount of heat that is transferred from heat source 18 to cover glass layer 12. For example, in operation, heat source 18 creates heat which would flow through stiffener 16 but be insulated from creating a hot spot on cover glass layer 12 through insulator layer 14.

Figure 3:
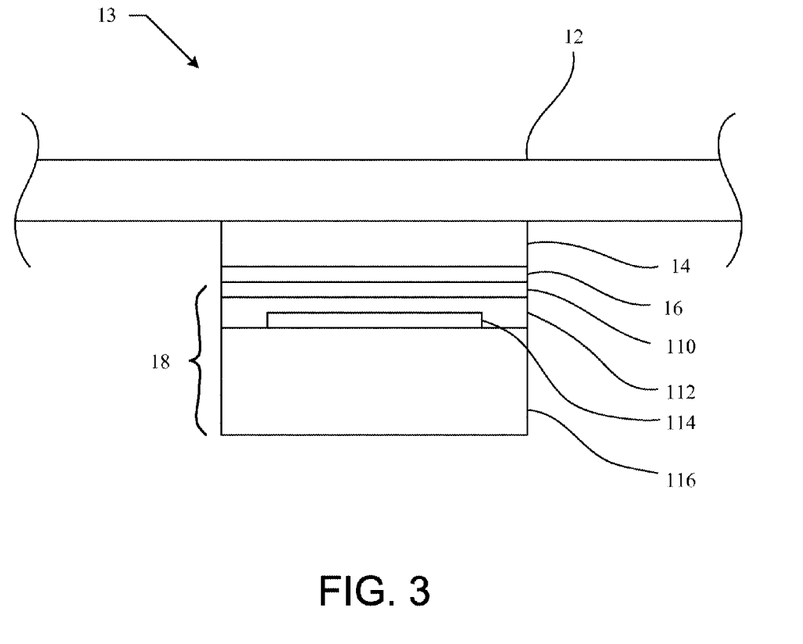
FIG. 3 shows an exemplary cross-sectional view of a portion of the device of FIG. 1.

As described above, heat source 18 may be any suitable device, including a camera. As shown in FIG. 3, heat source 18 represents a source of heat within electronic device 10. Heat source 18 can include lens stack 116, sensor 114, sensor housing 112, and flexible substrate 110. In one embodiment, heat source 18 can have a power density of approximately 2-7 mW/mm$^2$ when in operation. Moreover, heat source 18 can have footprint of approximately 40 mm$^2$. However, the footprint and power density shown are not meant to be limiting and the present disclosure can be applied to cameras with varying footprints and power densities. Furthermore, heat source 18 can be replaced by any electrical component having a similar footprint and power density. For example, heat source 18 can represent a light emitting diode or a small integrated circuit.

Heat source 18 can be bonded to stiffener 16. As described above, insulator layer 14 can reduce an amount of heat that is transferred from heat source 18 to cover glass layer 12. A user of electronic device 10 can often come into contact with an outer surface of cover glass layer 12. Thus, an increase in the temperature of cover glass layer 12 resulting from heat source 18 can cause a user's fingers to become uncomfortably hot during operation of electronic device 10. When insulator layer 14 has an aspect ratio of approximately 50 or less, providing insulator layer 14 between heat source 18 and cover glass layer 12 can substantially reduce an amount of heat transferred to cover glass layer 12, resulting in an exterior surface of electronic device 10 that is cooler to the touch. In one embodiment, insulator layer 14 can be formed from an insulation material such as aerogel. In another embodiment, insulator layer 14 can be constructed from a compliant material that protects heat source 18 from shock and vibrations imparted from cover glass layer 12.

Figure 4:
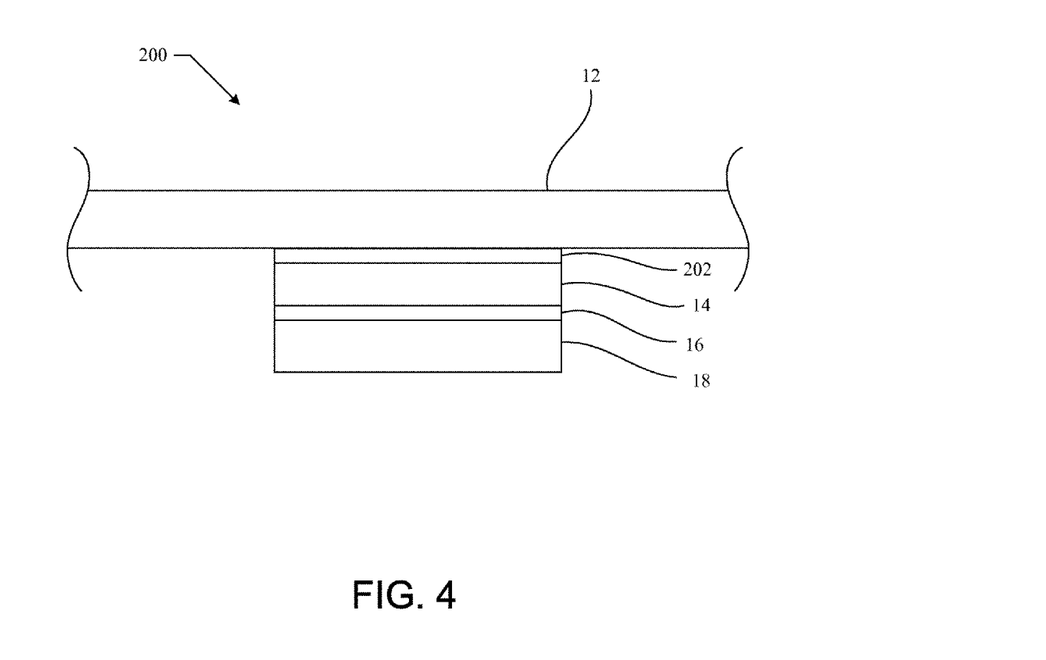
FIG. 4 shows an exemplary cross-sectional view of a portion of the device of FIG. 1.

FIG. 4 shows a cross sectional view of a portion of electronic device 200 including component 13, demonstrating another embodiment of the present disclosure. Electronic device 200 can include cover glass layer 12 and heat source 18 similar to electronic device 10. As with electronic device 10, heat source 18 can represent any heat source and cover glass layer 12 can represent any structure or component that can benefit from thermal shielding from heat source 18. Heat source 18 can be bonded to stiffener 16 and stiffener 16 can be bonded to insulator layer 14. In one embodiment, insulator layer 14 can be formed from an insulation material such as aerogel. As opposed to electronic device 10, electronic device 200 can include conductive layer or graphite layer 202 bonded between insulator 14 and cover glass layer 12. Graphite layer 202 can prevent a point on cover glass layer 12 from becoming significantly hotter than a surrounding region of cover glass layer 12 by spreading any heat transmitted through insulator 14 over a wider area. In one embodiment, a graphite layer with a thickness as small as approximately 10µm can be sufficient to spread heat across a desired area. In another embodiment, graphite layer 202 can be replaced with any material having a high thermal conductivity. For example, graphite layer 202 can be replaced by a thin layer of copper, aluminum or carbon fiber. When insulator layer 14 has an aspect ratio of approximately 50 or less, the combination of insulator layer 14 and graphite layer 202 between heat source 18 and cover glass layer 12 can substantially reduce an amount of heat transferred to cover glass layer 12, resulting in an exterior surface of electronic device 200 that is cooler to the touch.

Figure 5:
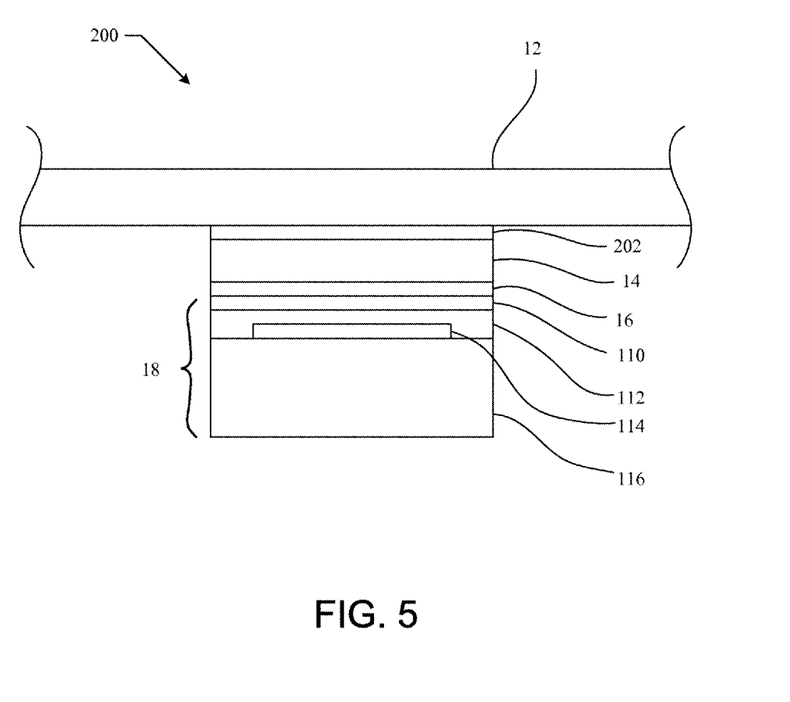
FIG. 5 shows an exemplary cross-sectional view of a portion of the device of FIG. 1.

As described above, heat source 18 may be any suitable device, including a camera. As shown in FIG. 5, heat source 18 represents a source of heat within electronic device 200. Heat source 18 can include lens stack 116, sensor 114, sensor housing 112, and flexible substrate 110. In one embodiment, heat source 18 can have a power density of approximately 2-7 mW/mm$^2$ when in operation. Moreover, heat source 18 can have footprint of approximately 40 mm$^2$. However, the footprint and power density shown are not meant to be limiting and the present disclosure can be applied to cameras with varying footprints and power densities. Furthermore, heat source 18 can be replaced by any electrical component having a similar footprint and power density. For example, heat source 18 can represent a light emitting diode or a small integrated circuit.

As also described above, graphite layer 202 can prevent a point on cover glass layer 12 from becoming significantly hotter than a surrounding region of cover glass layer 12 by spreading any heat transmitted through insulator 14 from heat source 18 over a wider area, thereby enhancing a user's experience on device 200.

Figure 6:
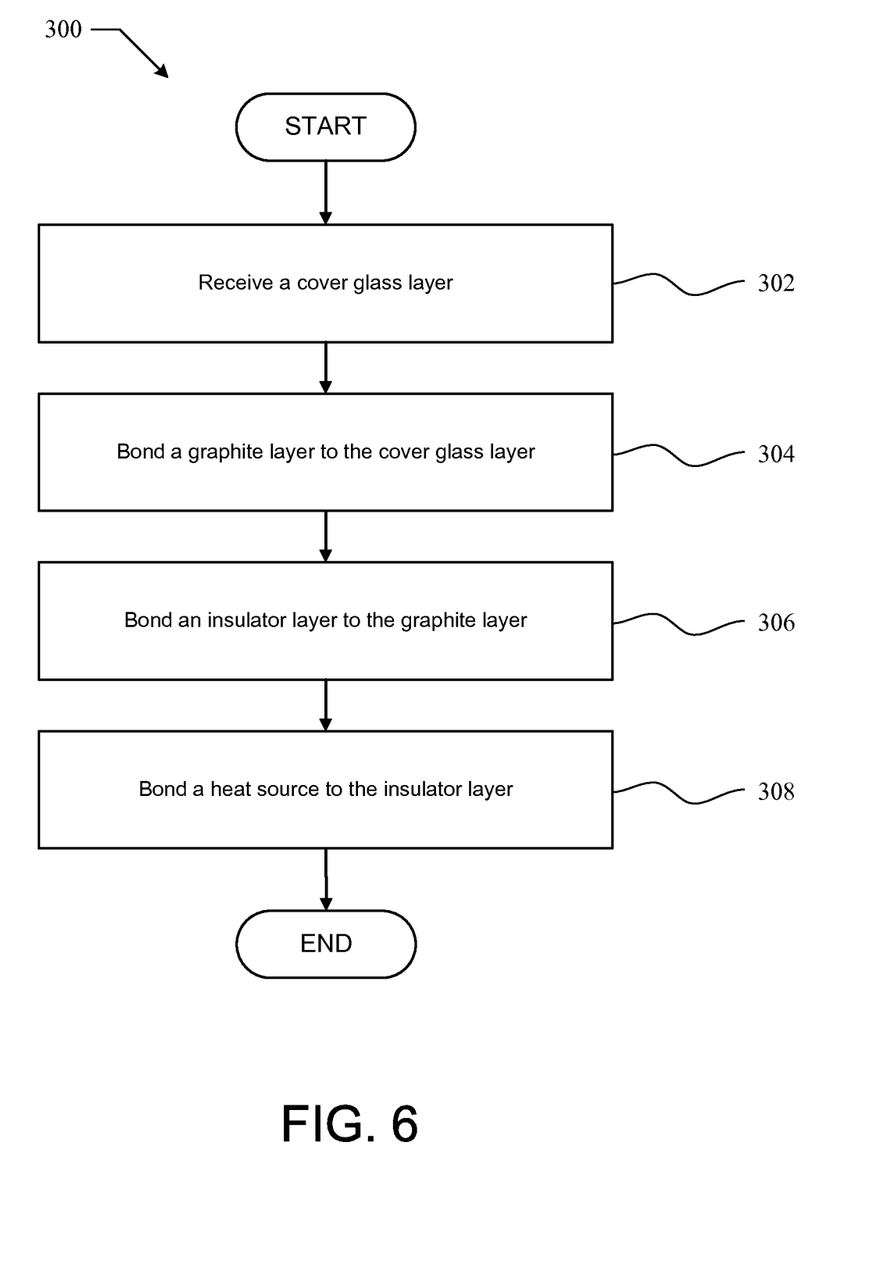
FIG. 6 shows flow chart describing a method for thermally insulating a cover glass layer from a heat source.

Devices 10 and 200 may be formed through any suitable process. According to one embodiment, a process may include bonding the one or more layers described above to cover glass layer 12. Thereafter, cover glass layer 12 may be assembled onto a housing such as housing 11. FIG. 6 shows a flow chart describing one exemplary process 300 for thermally insulating a cover glass layer (e.g., 12) from a heat source (e.g., 18) in accordance with the described embodiments. In step 302, a cover glass layer can be received. In step 304, a graphite layer can be bonded to the cover glass layer. In another embodiment, a thermally conductive layer formed from a material other than graphite can be used in place of the graphite layer. It should be understood that step 304 may be omitted in some embodiments, for example, if a graphite layer is not being used (e.g., device 10). In step 306 an insulator layer can be bonded to the graphite layer. In one embodiment, the insulator layer can be formed from aerogel. Finally, in step 308, a heat source such as a camera or light emitting diode can be bonded to the insulator layer. The insulator layer can prevent an amount of heat from being transmitted from the heat source to the cover glass layer.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic device, comprising:
   a cover glass layer having a touch screen capable of receiving a touch input;
   a conductive layer in direct contact with the cover glass layer, wherein the conductive layer is configured to spread heat across a region of the cover glass layer;
   an insulator layer in contact with the conductive layer; and a heat source in contact with the insulator layer, wherein the insulator layer is configured to reduce an amount of heat transmitted from the heat source to the cover glass layer.

2. The electronic device of claim 1, wherein the cover glass layer comprises a display.

3. The electronic device of claim 1, wherein the conductive layer is a graphite layer formed from graphite.

4. The electronic device of claim 3, wherein the conductive layer is about 30 μm thick.

5. The electronic device of claim 1, wherein the insulator layer has an aspect ratio of about 100.

6. The electronic device of claim 5, wherein the conductive layer is operative to prevent the heat that passes through the insulator layer from being concentrated on a surface portion of the cover glass layer disposed proximate to a central portion of the insulator layer.

7. The electronic device of claim 1, wherein the insulator layer comprises a polymer.

8. The electronic device of claim 1, wherein the heat source is a camera module.

9. The electronic device of claim 1, wherein the heat source is a light emitting diode.

10. The electronic device of claim 1, wherein the device is a mobile computing device, wherein the device further comprises a housing, and wherein the cover glass layer is arranged on or within the housing.

11. An electronic device, comprising:
a cover layer comprising a display and a touch screen;
an insulator layer disposed below and in thermal contact with the cover layer by
a heat spreading layer disposed between and in contact with the cover layer and the insulator layer;
a heat source disposed below and in thermal contact with the insulator layer, wherein the insulator layer is configured to reduce an amount of heat transmitted from the heat source to the cover layer; and
a stiffener disposed between the insulator layer and the heat source.

12. The electronic device of claim 11, wherein the cover layer is a cover glass layer of a display of the device.

13. The electronic device of claim 11, wherein the heat source is a light emitting diode.

14. The electronic device of claim 11, wherein the insulator layer comprises a polymer.

15. The electronic device of claim 11, wherein the heat source is a camera module.

16. The electronic device of claim 11, wherein the device is a mobile computing device, wherein the device further comprises a housing, and wherein the cover layer is arranged on or within the housing.

17. The electronic device of claim 11, wherein the heat source is an integrated circuit.

18. A method for reducing heat flow from a heat source to a cover glass layer in a mobile device, the method comprising:
bonding a conductive layer directly to the cover glass layer that includes a display and a touch screen, wherein the conductive layer is configured to spread heat across a region of the cover glass layer;
bonding an insulator layer to the conductive layer; and
bonding the heat source to the insulator layer, wherein the insulator layer is configured to reduce an amount of heat transmitted from the heat source to the cover layer.

19. The method of claim 18, wherein the conductive layer is a graphite layer.

20. The method of claim 18, wherein the heat source is a camera module.

* * * * *